US008582302B2

(12) United States Patent
Peterson et al.

(10) Patent No.: US 8,582,302 B2
(45) Date of Patent: Nov. 12, 2013

(54) MODULAR EQUIPMENT RACK SYSTEM FOR DATA CENTER

(75) Inventors: Eric C. Peterson, Woodinville, WA (US); Shaun L. Harris, Sammamish, WA (US); Mark Edward Shaw, Sammamish, WA (US); Matthew Allen Faist, El Dorado Hills, CA (US); Christian L. Belady, Mercer Island, WA (US); Darren Shakib, North Bend, WA (US)

(73) Assignee: Microsoft Corporation, Redmond, WA (US)

( * ) Notice: Subject to any disclaimer, the term of this patent is extended or adjusted under 35 U.S.C. 154(b) by 100 days.

(21) Appl. No.: 13/296,266

(22) Filed: Nov. 15, 2011

(65) Prior Publication Data

US 2013/0120941 A1    May 16, 2013

(51) Int. Cl.
  *H05K 7/14*  (2006.01)
(52) U.S. Cl.
  USPC .......................................... 361/724; 29/401.1
(58) Field of Classification Search
  USPC ............. 361/724, 725, 726, 796, 797; 211/26
  See application file for complete search history.

(56) References Cited

U.S. PATENT DOCUMENTS

| 7,278,273 | B1  | 10/2007 | Whitted et al. |
| 7,289,334 | B2  | 10/2007 | Behrens et al. |
| 7,646,590 | B1* | 1/2010  | Corhodzic et al. ............ 361/641 |
| 7,738,251 | B2  | 6/2010  | Clidaras et al. |
| 2005/0083651 | A1* | 4/2005  | Smith et al. .................... 361/687 |
| 2005/0117309 | A1* | 6/2005  | Rieken et al. .................. 361/724 |
| 2005/0259383 | A1* | 11/2005 | Ewing et al. ................... 361/622 |
| 2009/0034167 | A1* | 2/2009  | Rasmussen et al. ........... 361/627 |
| 2010/0172083 | A1* | 7/2010  | Randall et al. ............ 361/679.31 |
| 2012/0069514 | A1* | 3/2012  | Ross ........................ 361/679.33 |

OTHER PUBLICATIONS

"SPARC Enterprise M3000, M4000, M5000, M8000, and M9000 Server Architecture Flexible, Mainframe-Class Compute Power", Retrieved at <<http://www.oracle.com/technetwork/articles/systems-hardware-architecture/m-seriesarchitecture-163844.pdf>>, Apr. 2011, pp. 1-64.

"Best practices for HP 10000 Series and HP 10000 G2 Series Racks", Retrieved at <<http://h20000.www2.hp.com/bc/docs/support/SupportManual/c00883424/c00883424.pdf>>, Feb. 2007, pp. 1-48.

(Continued)

*Primary Examiner* — Timothy Thompson
*Assistant Examiner* — Charles Pizzuto
(74) *Attorney, Agent, or Firm* — Medley, Behrens & Lewis, LLC

(57) ABSTRACT

Various technologies described herein pertain to racking equipment in a data center. A modular equipment rack system can include an upper track, a lower track, a vertical support, a power and network distribution unit, and a tray. The upper track and the lower track can respectively include incrementally spaced mounting locations at which the vertical support and the power and network distribution unit can be attachable. The tray can be attachable to the vertical support and the power and network distribution unit when the vertical support is attached to the upper track at a first upper mounting location and attached to the lower track at a corresponding first lower mounting location, and the power and network distribution unit is attached to the upper track at a second upper mounting location and attached to the lower track at a corresponding second lower mounting location.

20 Claims, 9 Drawing Sheets

(56) References Cited

OTHER PUBLICATIONS

"Next Generation Data Center infrastructure", Retrieved at <<http://www.sgi.com/pdfs/4172.pdf>>, Retrieved Date: Sep. 9, 2011, pp. 1-12.

"Panduit Physical Infrastructure Reference Guide", Retrieved at <<http://www.cisco.com/en/US/docs/solutions/Enterprise/Borderless_Networks/Smart_Business_Architecture/H1CY11/SBA_Mid_BN_PanduitPhysicalInfrastructureReferenceGuide-H1CY11.pdf>, Retrieved Date: Sep. 9, 2011, pp. 1-30.

* cited by examiner

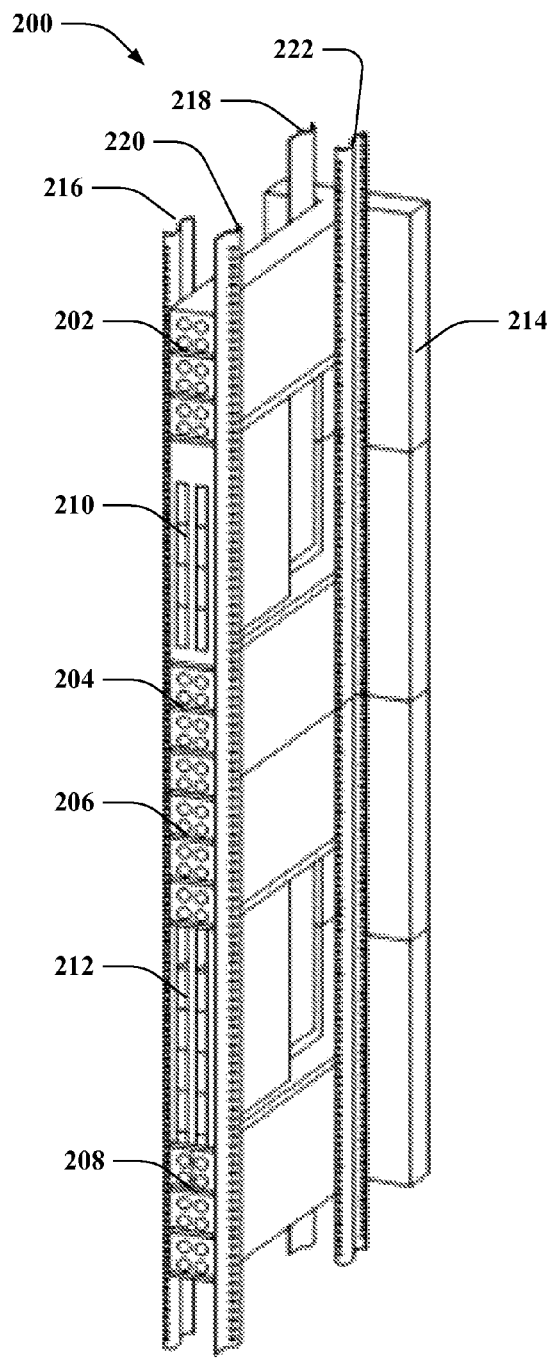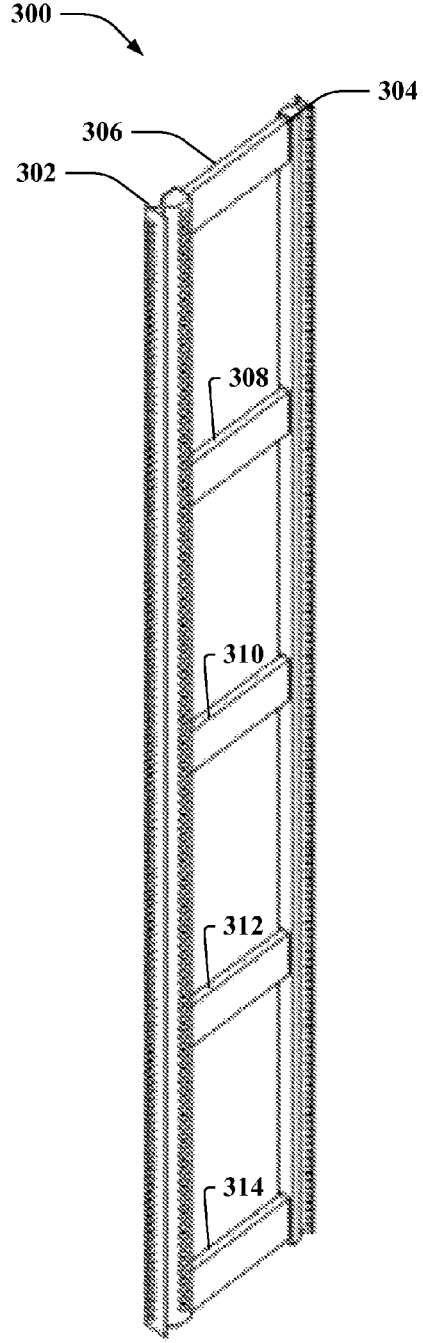
FIG. 2           FIG. 3

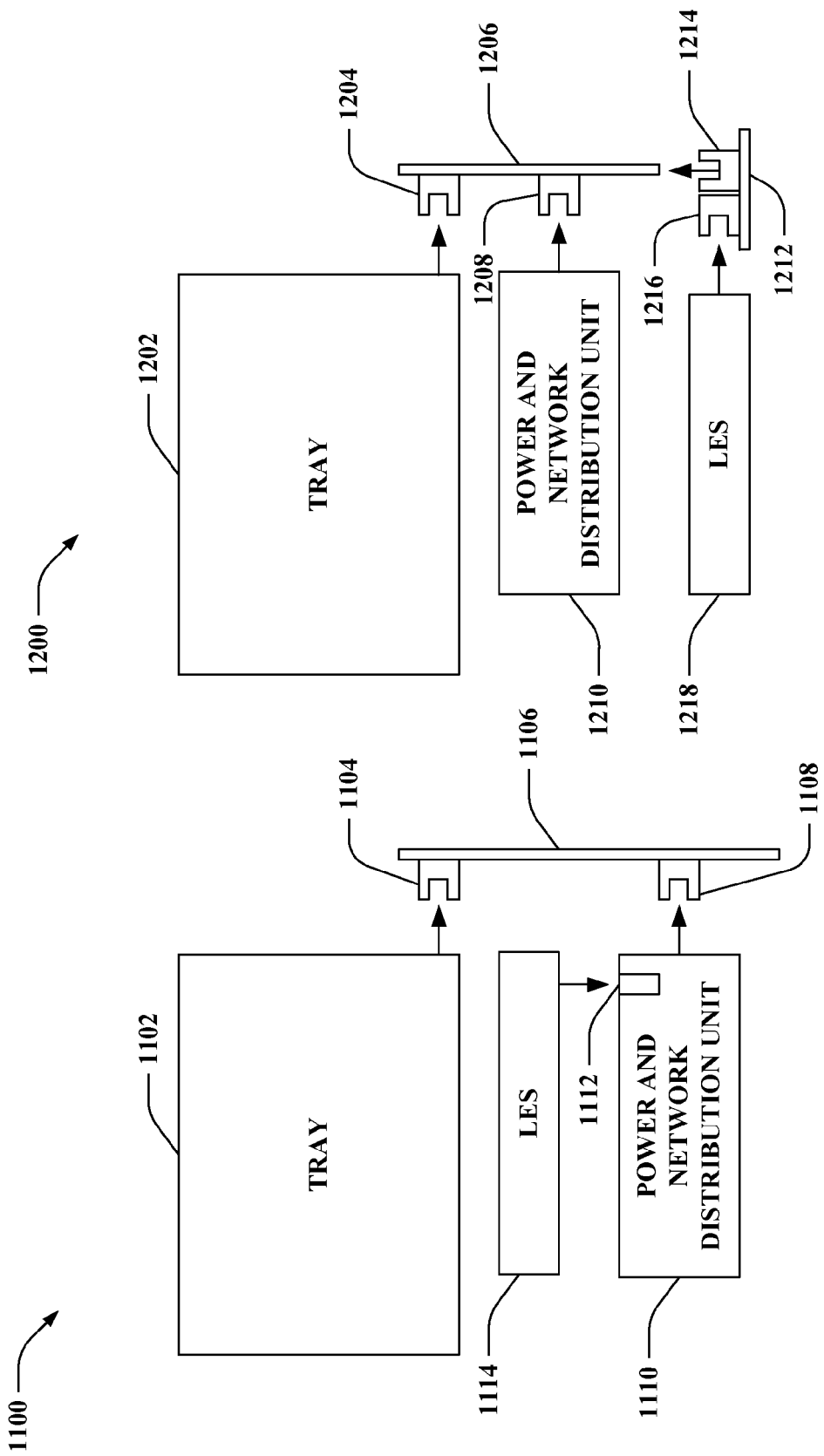

MODULAR EQUIPMENT RACK SYSTEM FOR DATA CENTER

BACKGROUND

A data center is a facility that houses computer equipment and related components. Data centers oftentimes include many server computers and auxiliary equipment such as, for instance, storage systems, network infrastructure equipment, and the like. Equipment is commonly accommodated and organized in data centers by being mounted on racks.

Rack mountable equipment for use in a data center is oftentimes designed to fit in conventional, standard equipment racks. Examples of such racks include racks that conform to standards such as Electronic Industries Alliance (EIA)-310-D, European Telecoms Standards Institute (ETSI), and so forth. Accordingly, configurations of rack mountable equipment commonly are limited by the configuration of the rack in which such equipment can be mounted. For example, a 19-inch rack that conforms to EIA-310-D can include a standardized frame or enclosure for mounting equipment that is approximately 17.75 inches wide. The equipment typically has a front panel that is approximately 19 inches wide with edges or ears that protrude in the width direction on each side such that the edges or ears allow the equipment to be fastened to the rack (e.g., with screws, clips, bolts, etc.). Pursuant to this example, the height of the equipment that is mountable in the 19-inch rack is commonly standardized to be a multiple of 1.75 inches (e.g., a rack unit).

Moreover, configuration of the equipment can be dependent on an application being run with the equipment. Accordingly, different equipment configurations with differing volumetric requirements can be used within a conventional data center. To accommodate the differing volumetric requirements for the different equipment configurations, disparate systems that fit within conventional, standard equipment racks oftentimes are employed, which can cause increased supply chain complexity.

Further, when servers are refreshed (e.g., after a few years of use), other equipment such as power supplies, fans, sheet metal, connectors, batteries, etc. is oftentimes replaced as a result of being part of the infrastructure installed in a rack with the servers or a container in which the servers are included. For instance, a typical blade system can include a chassis that mounts into a conventional, standard equipment rack. The chassis can include slides or housings into which a plurality of blades (e.g., servers) can be inserted. However, the chassis of a typical blade system oftentimes is able to couple with blades having a fixed size. Moreover, blades for a chassis of a particular manufacturer commonly differ in size from blades for a chassis of a different manufacturer. Thus, if the blades are refreshed (e.g., when upgrading after a few years, etc.), then the chassis commonly is unable to be reused and oftentimes replaced.

SUMMARY

Described herein are various technologies that pertain to racking equipment in a data center. A modular equipment rack system for a data center can include an upper track, a lower track, a vertical support, a power and network distribution unit, and a tray. The upper track can include upper mounting locations incrementally spaced along a length of the upper track, and the lower track can include lower mounting locations incrementally spaced along a length of the lower track. Further, the vertical support and the power and network distribution unit can be attachable to the upper track at the upper mounting locations and attachable to the lower track at the lower mounting locations. Moreover, the tray can be attachable to the vertical support and the power and network distribution unit when the vertical support is attached to the upper track at a first upper mounting location and attached to the lower track at a corresponding first lower mounting location, and the power and network distribution unit is attached to the upper track at a second upper mounting location and attached to the lower track at a corresponding second lower mounting location.

According to various embodiments described herein, a modular equipment rack system can be mountable in a rack. The modular equipment rack system can include a power and network distribution unit and a guide module, where the guide module can be mountable above and/or below the power and network distribution unit in the rack. The power and network distribution unit can include a backplane, where the backplane can include tray connection points. Moreover, the modular equipment rack system can include a tray that can be receivable between the power and network distribution unit and the guide module. The tray can be receivable when the power and network distribution unit is mounted at a first position in the rack and the guide module is mounted at a second position in the rack, where the first position is above or below the second position in the rack. Further, the power and network distribution unit can supply power and networking to the tray though a particular tray connection point when coupled with the tray.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

BRIEF DESCRIPTION OF THE DRAWINGS

FIG. 2 illustrates an isometric view of an exemplary power and network distribution unit that can be used in the modular equipment rack system of FIG. 1.

FIG. 3 illustrates an isometric view of an exemplary vertical support that can be used in the modular equipment rack system of FIG. 1.

FIGS. 11-12 illustrate schematic diagrams of exemplary systems that provides power to a tray.

DETAILED DESCRIPTION

Figure 1:
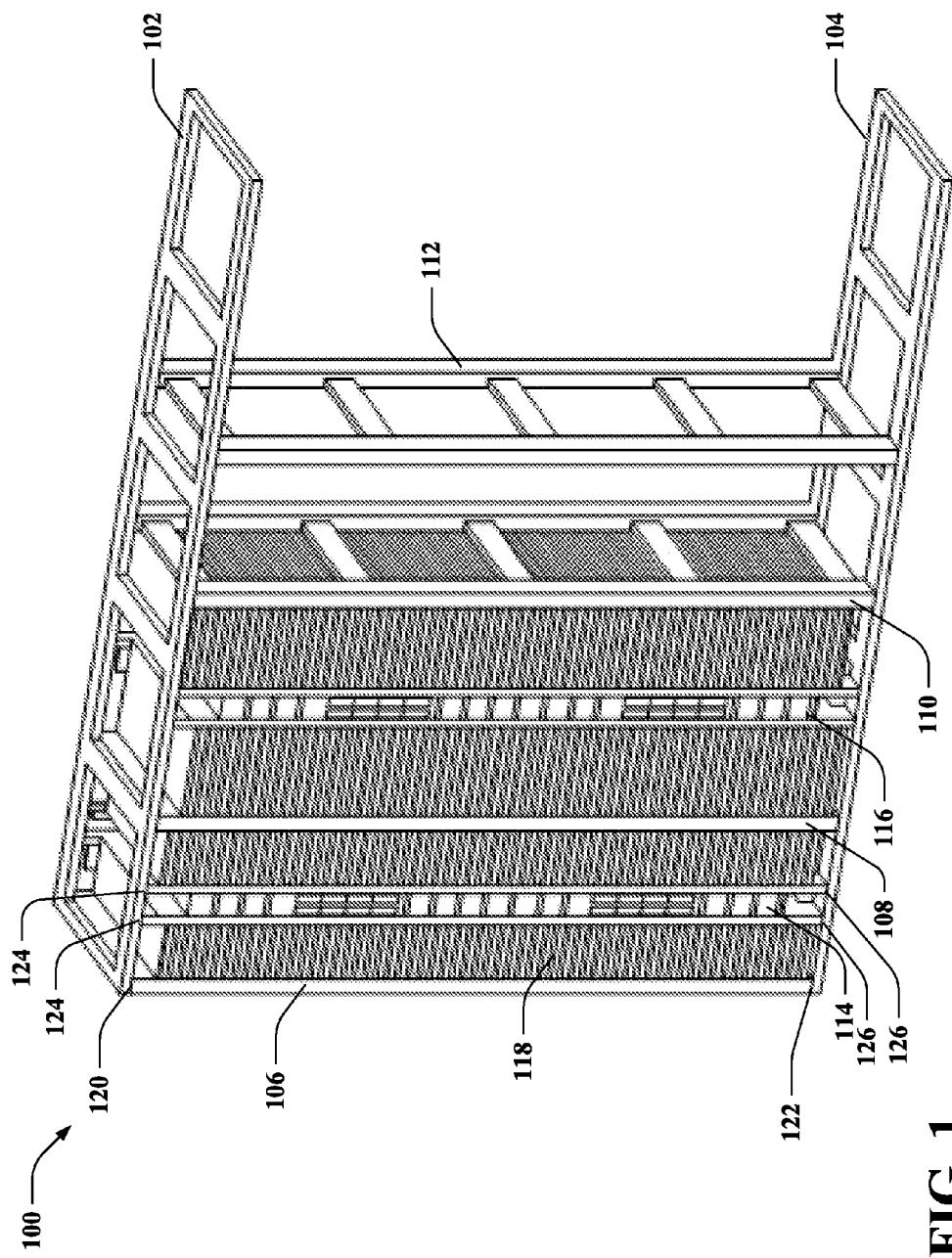
FIG. 1 illustrates an isometric view of an exemplary modular equipment rack system for a data center.

Various technologies pertaining to racking equipment in a data center are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

As set forth herein, a modular equipment rack system for a data center can simplify upgrading or refreshing equipment mounted within such a system. The modular equipment rack system can be an adjustable support structure that can provide configuration flexibility, thereby mitigate size constraints of equipment that can be mounted within the system oftentimes associated with conventional, standard equipment racks while allowing for reconfiguration. For instance, components of the modular equipment rack system can be reused and/or reconfigured when equipment mounted within the system is upgraded or refreshed.

As described herein, the modular equipment rack system can include a power and network distribution unit and a support member (e.g., vertical support, guide module, etc.) that can be located at a distance from each other. The distance can be changed to accommodate various sizes of trays, where a tray can include server(s), storage device(s), a combination thereof, etc. Thus, if a size of tray(s) is changed when upgrading or refreshing servers, storage devices, etc., then the distance between the power and network distribution unit and the support member can be altered, thereby allowing for reuse of such components. Further, the modular equipment rack system can support a configuration where more than one tray size is employed.

Referring now to the drawings, FIG. 1 illustrates an isometric view of an exemplary modular equipment rack system 100 for a data center. The modular equipment rack system 100 includes an upper track 102 and a lower track 104. The upper track 102 includes upper mounting locations incrementally spaced along a length of the upper track 102. Similarly, the lower track 104 includes lower mounting locations incrementally spaced along a length of the lower track 104.

Moreover, the modular equipment rack system 100 can include one or more vertical supports. As shown in the depicted example of FIG. 1, the modular equipment rack system 100 includes four vertical supports: vertical support 106, vertical support 108, vertical support 110, and vertical support 112 (collectively referred to as vertical supports 106-112). It is to be appreciated, however, that the modular equipment rack system 100 can include substantially any number of vertical supports and is not limited to including the four vertical supports 106-112 illustrated in FIG. 1.

The vertical supports 106-112 are attachable to the upper track 102 and the lower track 104. The vertical supports 106-112 are attachable to the upper track 102 at the upper mounting locations. Further, the vertical supports 106-112 are attachable to the lower track 104 at the lower mounting locations. Thus, top ends of the vertical supports 106-112 are capable of being fastened, secured, joined, etc. to the upper track 102 at any of the upper mounting locations of the upper track 102, and bottom ends of the vertical supports 106-112 are capable of being fastened, secured, joined, etc. to the lower track 104 at any of the lower mounting locations of the lower track 104.

The modular equipment rack system 100 can further include one or more power and network distribution units. The example illustrated in FIG. 1 shows the modular equipment rack system 100 including two power and network distribution units: power and network distribution unit 114 and power and network distribution unit 116 (collectively referred to as power and network distribution units 114-116). Moreover, it is contemplated that the modular equipment rack system 100 can include substantially any number of network and power distribution units and is not limited to including the two network and power distribution units 114-116 depicted in FIG. 1.

Similar to the vertical supports 106-112, the power and network distribution units 114-116 are attachable to the upper track 102 and the lower track 104. The power and network distribution units 114-116 are attachable to the upper track 102 at the upper mounting locations. Moreover, the power and network distribution units 114-116 are attachable to the lower track 104 at the lower mounting locations. Accordingly, top ends of the power and network distribution units 114-116 are capable of being fastened, secured, joined, etc. to the upper track 102 at any of the upper mounting locations of the upper track 102, and bottom ends of the power and network distribution units 114-116 are capable of being fastened, secured, joined, etc. to the lower track 104 at any of the lower mounting locations of the lower track 104.

According to an example, the upper track 102 can be installed on a ceiling of a data center and the lower track 104 can be installed on a floor of the data center. By way of another example, it is contemplated that the upper track 102 can be a floating member and the lower track 104 can be installed on the floor of the data center. Following this example, the lower track 104 can be installed on the floor of the data center, bottom end(s) of one or more of the vertical supports 106-112 and/or one or more of the network and power distribution units 114-116 can be attached to the lower track 104, and thereafter the upper track 102 can be attached to top end(s) of the one or more of the vertical supports 106-112 and/or the one or more of the network and power distribution units 114-116 attached to the lower track 104. Additionally or alternatively, top end(s) of one or more of the vertical supports 106-112 and/or one or more of the network and distribution units 114-116 can be attached to the upper track 102, and thereafter bottom end(s) of the one or more of the vertical supports 106-112 and/or the one or more of the network and power distribution units 114-116 attached to the upper track 102 can be attached to the lower track 104. It is to be appreciated, however, that the claimed subject matter is not limited to the foregoing illustrations.

Further, the upper track 102 and the lower track 104 can accept mounting of the vertical supports 106-112 or the network and power distribution units 114-116 at a standard increment. By way of example, the standard increment can be approximately one inch. Following this example, upper mounting locations of the upper track 102 can be spaced at an increment of substantially one inch along the length of the upper rack 102 and lower mounting locations of the lower track 104 can be spaced at an increment of substantially one inch along the length of the lower track 104. Yet, it is contemplated that the upper mounting locations and the lower mounting locations can be spaced at an increment other than approximately one inch.

As depicted in FIG. 1, the vertical support 106 (e.g., a top end of the vertical support 106) is attached to the upper track 102 at a first upper mounting location 120. The vertical support 106 (e.g., a bottom end of the vertical support 106) is also attached to the lower track 104 at a first lower mounting location 122, where the first lower mounting location 122 corresponds with the first upper mounting location 120 (e.g., the first lower mounting location 122 and the first upper mounting location 120 are aligned). Moreover, the power and network distribution unit 114 (e.g., a top end of the power and network distribution unit 114) is attached to the upper track 102 at a second upper mounting location 124. The power and network distribution unit 114 (e.g., a bottom end of the power and network distribution unit 114) is attached to the lower track 104 at a second lower mounting location 126. Further, the second lower mounting location 126 corresponds with the second upper mounting location 124 (e.g., the second lower mounting location 126 and the second upper mounting location 124 are aligned).

Moreover, one or more trays (e.g., a tray 118, etc.) can be attachable to the vertical support 106 and the power and network distribution unit 114, which are attached to the upper track 102 and the lower track 104 as illustrated in FIG. 1. A tray can include server(s), storage device(s), a combination thereof, and the like. Further, a tray can include a connector suitable for blind mating at a rear of the tray, where the connector can interconnect with a power and network distribution unit. According to an illustration, a tray can include a blind mate connector that couples with the power and network distribution unit 114 when the tray is attached to the vertical support 106 and the power and network distribution unit 114.

The modular equipment rack system 100, as configured in FIG. 1, supports trays of different widths. Accordingly, trays that include different server configurations, numbers of storage devices, etc. can be used with the modular equipment rack system 100. More particularly, the vertical supports 106-112 and the power and network distribution units 114-116 can be attached at different mounting locations (or pitches) on the mounting tracks (e.g., the upper track 102 and the lower track 104) to accommodate variation in tray dimensions. Further, in a given column (e.g., between the vertical support 106 and the power and network distribution unit 114, etc.), the trays can have substantially similar widths. However, trays in different columns can have different widths. In accordance with the depicted example, narrow trays can be attachable between the vertical support 106 and the power and network distribution unit 114, narrow trays can be attachable between the power and network distribution unit 114 and the vertical support 108, wide trays can be attachable between the vertical support 108 and the power and network distribution unit 116, and wide trays can be attachable between the power and network distribution unit 114 and the vertical support 110. Moreover, the vertical support 110 and the vertical support 112 can be positioned within the modular equipment rack system 100 to support standard equipment (e.g., configured as a standard 19-inch rack portion within the modular equipment rack system 100). Yet, it is to be appreciated that the claimed subject matter is not so limited.

Moreover, the modular equipment rack system 100 can be reconfigurable. Accordingly, the vertical supports 106-112 and the power and network distribution units 114-116 can be slidable on the upper track 102 and the lower track 104. For instance, the upper track 102 and the lower track 104 can be substantially similar to seat tracks in an airplane; yet, the claimed subject matter is not so limited. Additionally or alternatively, vertical support(s) and/or power and network distribution unit(s) can be added to or removed from the modular equipment rack system 100 during reconfiguration.

By way of example, a first tray (e.g., the tray 118, etc.) having a first width can be attachable to the vertical support 106 and the power and network distribution unit 114 when positioned as shown in FIG. 1. Following this example, when refreshing equipment (e.g., upgrading a server attached to the first tray), the vertical support 106 and/or the power and network distribution unit 114 can be slid along the upper track 102 and the lower track 104 to be separated at a distance suitable for attaching to a second tray having a second width. The second width, for instance, can be wider or narrower than the first width. According to an illustration, the second tray with a different width compared to the first tray can be attachable to the vertical support 106 and the power and network distribution unit 114 when the vertical support 106 is attached to the upper track at a third upper mounting location and attached to the lower track at a third lower mounting location that corresponds with the third upper mounting location, where the first and third upper mounting locations differ and the first and third lower mounting locations differ. Additionally or alternatively, the second tray can be attachable to the vertical support 106 and the power and network distribution unit 114 when the power and network distribution unit 114 is attached to the upper track at a fourth upper mounting location and attached to the lower track at a fourth lower mounting location that corresponds with the fourth upper mounting location, where the second and fourth upper mounting locations differ and the second and fourth lower mounting locations differ. It is to be appreciated, however, that that claimed subject matter is not limited to the foregoing example.

Now turning to FIG. 2, illustrated is an isometric view of an exemplary power and network distribution unit 200 (e.g., one of the power and network distribution units 114-116 of FIG. 1). The power and network distribution unit 200 supplies power and networking to tray(s) (e.g., the tray 118 of FIG. 1, etc.) when the tray(s) are attached thereto. According to the illustrated example of FIG. 2, the power and network distribution unit 200 can include a power unit that supplies power to one or more electronic assemblies (e.g., the trays). However, in accordance with another example (not shown), the power and network distribution unit 200 can couple with a power unit that supplies power to the one or more electronic assemblies.

The power unit can convert alternating current (AC) voltage (e.g., 115 VAC to 480 VAC) to a distribution voltage (e.g., 12 VDC to 400 VDC) used to run associated electronics. Moreover, the power unit can provide power smoothing. The power unit included in and/or coupled with the power and network distribution unit 200 can include one or more power supplies. For instance, the power unit can include a plurality of power supplies that are coupled together to supply power while providing redundancy (e.g., in the event of failure of one or more power supply). According to the depicted example of FIG. 2, the power and network distribution unit 200 can include four power supplies (e.g., the power unit): a power supply 202, a power supply 204, a power supply 206, and a power supply 208 (collectively referred to as power supplies 202-208); however, it is to be appreciated that the claimed subject matter is not limited to the example shown in FIG. 2. Moreover, the power unit can include a connection point (not shown) for joining to other power unit(s) (e.g., included in or coupled with disparate power and network distribution unit(s)) to provide power redundancy in the event of power supply failure.

Moreover, the power supplies 202-208 can provide local energy storage (LES) functionality in the event of a utility power failure. Additionally or alternatively, the power supplies 202-208 can be connected to a LES (not shown) to provide LES functionality. For instance, the LES can be connected to a connection point that adds the LES to output of the power supplies 202-208; yet, the claimed subject matter is not so limited.

Further, a power and network distribution unit can include one or more network switches. In the example depicted in FIG. 2, the power and network distribution unit 200 includes two network switches: a network switch 210 and a network switch 212 (collectively referred to as network switches 210-212). The network switches 210-212 in the power and network distribution unit 200 can be replaceable and/or upgradable.

Moreover, the power and network distribution unit 200 can include a backplane 214 that includes tray connection points that are respectively connectable with blind mate connectors of trays. The backplane 214 can distribute power from the power unit (e.g., the power supplies 202-208) to tray(s) connected therewith via the tray connection points. Additionally or alternatively, the backplane 214 can provide the network switches 210-212 with network distribution to the tray(s) connected therewith via the tray connection points. Hence, the network switches 210-212 can connect with the backplane 214, which can directly connect with the tray(s), thereby mitigating use of cables from the network switches 210-212 to the tray(s). However, according to other examples, it is to be appreciated that the network switches 210-212 can be connected to the tray(s) via cables.

The power and network distribution unit 200 can also supply control signals to tray(s) connected therewith via the tray connection points. The power and network distribution unit 200 can include a rack level or chassis level controller (not shown), for example. Such controller can monitor systems attached to the power and network distribution unit 200 and/or provide a control interface to the systems attached to the power and network distribution unit 200. Accordingly, the power and network distribution unit 200 can support signaling for system control and/or error monitoring.

The power and network distribution unit 200 can also include a support structure that is attachable to an upper track (e.g., the upper track 102 of FIG. 1) and a lower track (e.g., the lower track 104 of FIG. 1). In the depicted example of FIG. 2, the support structure of the power and network distribution unit 200 can include four vertical rails: a vertical rail 216, a vertical rail 218, a vertical rail 220, and a vertical rail 222 (collectively referred to as vertical rails 216-222). The vertical rails 216-222 can each be attached to the power supplies 202-208, the network switches 210-212, the backplane 214, or a respective subset thereof. According to an example, the vertical rail 216 and the vertical rail 220 can be attached to the power supplies 202-208 and the network switches 210-212, and the vertical rail 218 and the vertical rail 222 can be attached to the power supplies 202-208; however, it is to be appreciated that the claimed subject matter is not so limited.

Moreover, the power and network distribution unit 200 includes vertical mounting locations incrementally spaced along a height of the power and network distribution unit 200. For instance, the support structure (e.g., the vertical rails 216-222) can include vertical mounting locations. According to an example, the vertical mounting locations can be spaced at an increment of substantially 1.75 inches (e.g., a rack unit) along the vertical rails 216-222 in the height direction. However, it is contemplated that the spacing between the vertical mounting locations along the height of the power and network distribution unit 200 can be substantially any other increment, and is not limited to being approximately 1.75 inches.

Tray(s) are attachable to the vertical mounting locations of the power and network distribution unit 200. Moreover, the power and network distribution unit 200 can support double-sided mounting (e.g., trays can be attached to both sides of the power and network distribution unit 200 at vertical mounting locations). For example, a first set of trays can be attached to the vertical rail 216 and the vertical rail 218, and a second set of trays can be attached to the vertical rail 220 and the vertical rail 222.

According to an example, the power and network distribution unit 200 can be approximately four inches wide. However, it is to be appreciated that the claimed subject matter is not so limited, and any width of the power and network distribution unit 200 is intended to fall within the scope of the hereto appended claims.

In accordance with another example, the power and network distribution unit 200 (e.g., the power supplies 202-208, the network switches 210-212, LESs, etc.) can have a longer life compared to a server. Accordingly, short life technology components (e.g., attachable to a tray) can be separated from longer life technology components. Thus, when short life technology components are upgraded, the longer life technology components need not be replaced (e.g., the power supplies 202-208 can be replaced when the technology is obsolete as opposed to when a server is refreshed since power supply technology tends not to change as rapidly as server technology). Rather, the longer life technology components can continue to be used after an upgrade of the server.

Pursuant to another example, the power supplies 202-208 can be commodity components. Following this example, customization of system power within the power and network distribution unit 200 can be supported by loading different wattage power supplies and/or partially populating the power and network distribution unit 200 with power supplies (e.g., the power and network distribution unit 200 can include a subset of the power supplies 202-208). In contrast, if customized power supplies are employed as opposed to commoditized power supplies, such customization can be more expensive. It is to be appreciated, however, that the claimed subject matter is not limited to the foregoing example.

Now referring to FIG. 3, illustrated is an isometric view of an exemplary vertical support 300 (e.g., one of the vertical supports 106-112 of FIG. 1). The vertical support 300 includes two double-sided vertical rails: a double-sided vertical rail 302 and a double-sided vertical rail 304 (collectively referred to as double-sided vertical rails 302-304). Moreover, as shown in the example of FIG. 3, the vertical support 300 includes a plurality of cross members attached between the double-sided vertical rails 302-304: a cross member 306, a cross member 308, a cross member 310, a cross member 312, and a cross member 314 (collectively referred to as cross members 306-314). Yet, it is to be appreciated that the claimed subject matter is not limited to the foregoing example.

Further, the vertical support 300 includes vertical mounting locations incrementally spaced along a height of the vertical support 300. The double-sided vertical rails 302-304 can include the vertical mounting locations along two sides thereof, where the vertical mounting locations are incrementally spaced in the height direction. According to an example, the vertical mounting locations can be spaced at an increment of substantially 1.75 inches (e.g., a rack unit) along the double-sided vertical rails 302-304 in the height direction. Yet, it is contemplated that the spacing between the vertical mounting locations along the height of the vertical support 300 can be substantially any other increment, and is not limited to being approximately 1.75 inches. By way of example, a tray can be attached to the vertical support 300 at a first vertical mounting location on the vertical support 300 and attached to a power and network distribution unit at a corresponding first vertical mounting location on the power and network distribution unit.

The vertical support 300 can provide guidance and support for an edge of a tray. For instance, an edge of a tray can be attached to the vertical support 300 and an opposite edge of the tray can be attached to a power and network distribution unit (e.g., one of the power and network distribution units 114-116 of FIG. 1, the power and network distribution unit 200 of FIG. 2, etc.). However, it is also contemplated that the opposite edge of the tray can be attached to a disparate vertical support, which can be substantially similar to the vertical support 300.

Figure 4:
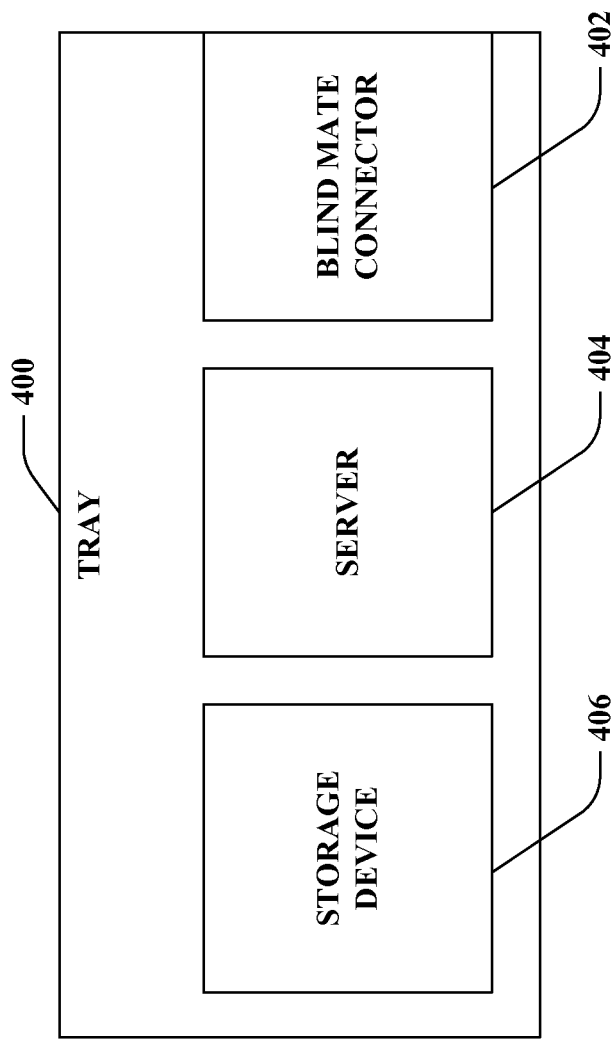
FIG. 4 illustrates a functional block diagram of an exemplary tray.

With reference to FIG. 4, illustrated is a block diagram of an exemplary tray 400. The tray 400 can be substantially any size. Further, the tray 400 can be made of metal; however, the claimed subject matter is not so limited.

The tray 400 can be attachable to a power and network distribution unit (e.g., one of the power and network distribution units 114-116 of FIG. 1, the power and network distribution unit 200 of FIG. 2, etc.) and a vertical support (e.g., one of the vertical supports 106-112 of FIG. 1, the vertical support 300 of FIG. 3, etc.). The tray 400 includes a blind mate connector 402 that couples with the power and network distribution unit when the tray 400 is attached to the power and network distribution unit and the vertical support. For instance, the blind mate connector 402 can be at a rear edge of the tray 400. Moreover, the blind mate connector 402 can be suitable for interconnecting the tray 400 with a tray connection point of a backplane, where the power and network distribution unit includes the backplane. The blind mate connector 402 can reduce an amount of recabling to be performed during an upgrade.

The tray 400 can further include a server 404 and/or a storage device 406 (e.g., the server 404 and the storage device 406 can be attached to the tray 400). According to an example, the tray 400 can include a plurality of servers similar to the server 404. Additionally or alternatively, the tray 400 can include a plurality of storage devices similar to the storage device 406. Moreover, the storage device 406 can be a hard drive (HDD), a solid-state drive (SSD), or the like. It is also contemplated that the tray 400 can include other components such as, for instance, a battery (e.g., LES) and so forth. Further, the tray 400 can adapt commodity components such as the server 404 and the storage device 406 to a standard connection (e.g., via the blind mate connector 402).

In accordance with an example, the blind mate connector 402 can be a standalone module on the tray 400. Following this example, the blind mate connector 402 can convert an interface from the server 404 to an interface that can interconnect with a power and network distribution unit. By way of another example, the blind mate connector 402 can be part of the server 404 (e.g., part of a server motherboard).

According to an example, as server technology changes, a size of a server board oftentimes can become smaller. Thus, if the server 404 is replaced with an upgraded server having a smaller server board, then the server 404 can be removed from the tray 400 and the upgraded server can be attached to the tray 400. Alternatively, the upgraded server can be attached to a disparate tray with a substantially similar size compared to the tray 400. Accordingly, the tray 400 or the disparate tray with the substantially similar size can continue to be attachable to the power and network distribution unit and the vertical support without rearrangement.

By way of another example, if the server 404 is replaced with the upgraded server having the smaller server board, then the upgraded server can be attached to a disparate tray with a smaller size compared to the tray 400. Following this example, the power and network distribution unit and the vertical support can be repositioned with respect to each other (e.g., moved closer to be separated by a distance suitable for attaching to the smaller disparate tray), and thereafter, the smaller disparate tray can be attachable to the power and network distribution unit and the vertical support. Additionally or alternatively, the smaller disparate tray (e.g., narrower than the tray 400, etc.) can be attachable to a different power and network distribution unit and/or a different vertical support, which are located closer to each other at a distance suitable for attaching to the smaller disparate tray.

Further, it is contemplated that the tray 400 can optionally include an interface board that provides the blind mate connector 402 and additional functionality that can be used to adapt commodity components (e.g., the server 404, storage device 406, etc.) to the standard connector. The other functionality, for instance, can be additional power conversion to supply additional voltages to the server 404 (e.g., a voltage other than a standard voltage supplied by the power supplies 202-208 of FIG. 2). In accordance with an example, the power supplies 202-208 of FIG. 2 can distribute 12 VDC to the tray 400. Following this example, the interface board can convert the 12 VDC distributed voltage to different voltage (e.g., 5 VDC), which can be provided to the server 404; yet, it is to be appreciated that the claimed subject matter is not limited to the foregoing example. Additionally or alternatively, the interface board can provide additional regulation of the distributed voltage if necessary. By way of yet another example, the interface board can allow the tray 400 to individually control power for the tray 400 (e.g., separate from other trays used within a modular equipment rack system).

Figure 5:
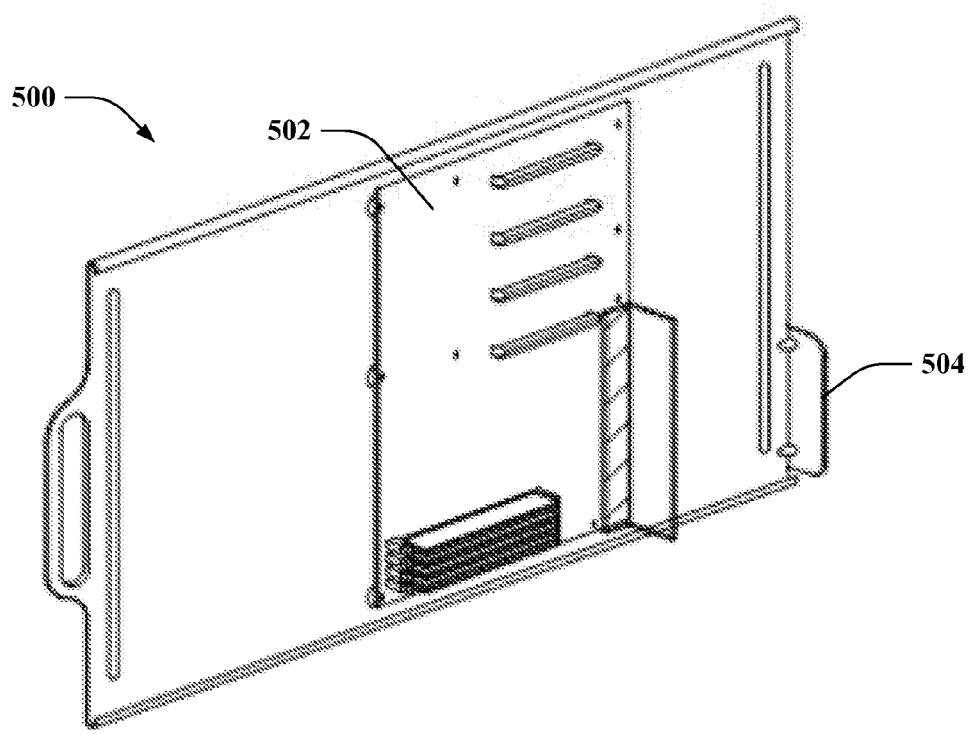
FIGS. 5-6 illustrate isometric views of exemplary trays that can support different server board configurations.
Figure 6:
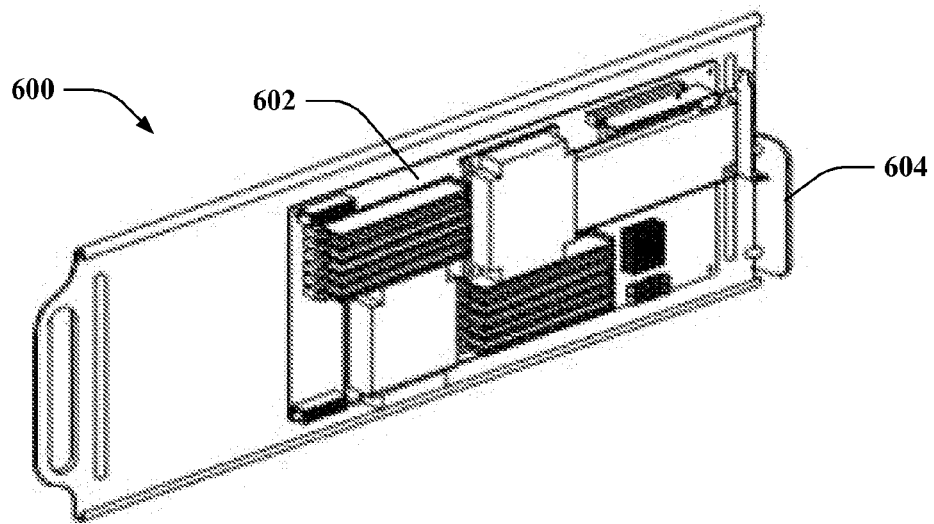

Now turning to FIGS. 5-6, illustrated are isometric views of exemplary trays that can support different server board configurations. It is to be appreciated, however, that the claimed subject matter is not limited to the examples shown in FIGS. 5-6. For instance, storage device(s) such as HDDs or SSDs can be added to the exemplary trays shown in FIGS. 4-5. According to another illustration, disparate trays can include such storage device(s) without including a server board. Moreover, it is to be appreciated that substantially any other type of equipment can be included on the trays shown in FIG. 5-6, the disparate trays that include storage device(s), or separate trays.

With reference to FIG. 5, illustrated is a tray 500 that includes a server motherboard 502 with a first form factor. Further, the tray 500 includes a blind mate connector 504 at a rear edge of the tray 500. The blind mate connector 504 is suitable for interconnecting the tray 500 with a power and network distribution unit (e.g., one of the power and network distribution units 114-116 of FIG. 1, the power and network distribution unit 200 of FIG. 2, etc.).

Turning to FIG. 6, illustrated is a tray 600 that includes a server motherboard 602 with a second form factor. Similar to the tray 500 of FIG. 5, the tray 600 includes a blind mate connector 604 that is suitable for interconnecting the tray 600 with a power and network distribution unit (e.g., one of the power and network distribution units 114-116 of FIG. 1, the power and network distribution unit 200 of FIG. 2, etc.). As illustrated, a width of the tray 600 is narrower than a width of the tray 500 of FIG. 5.

Figure 7:
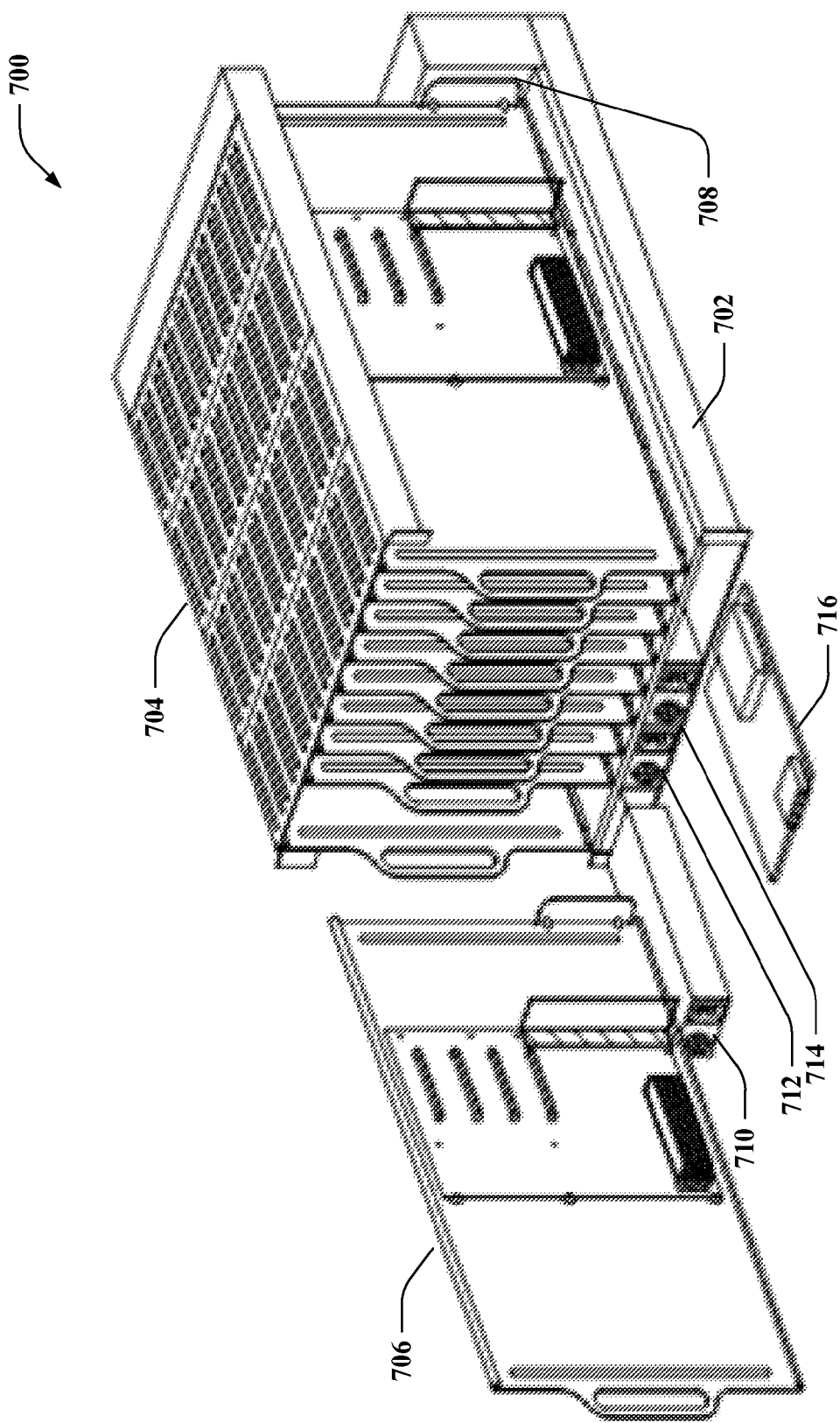
FIG. 7 illustrates an isometric view of another exemplary modular equipment rack system for a data center.

Now referring to FIG. 7, illustrated is an isometric view of another exemplary modular equipment rack system 700 for a data center. The modular equipment rack system 700 includes a power and network distribution unit 702 and a guide module 704. Similar to the power and network distribution units 114-116 of FIG. 1 and the power and network distribution unit 200 of FIG. 2, the power and network distribution unit 702 can supply power and networking to one or more trays (e.g., a tray 706, etc.) attached thereto. For instance, the one or more trays can be substantially similar to the tray 400 of FIG. 4, the tray 500 of FIG. 5, or the tray 600 of FIG. 6.

The power and network distribution unit 702 can be mountable in a rack. For example, the power and network distribution unit 702 can be mountable in a standard rack (e.g., a 19-inch rack, a 23-inch rack, 24-inch rack, 28-inch rack, etc.). However, it is to be appreciated that the power and network distribution unit 702 can be mountable in substantially any other type of rack (e.g., the power and network distribution unit 702 can be mountable in the modular equipment rack system 100 of FIG. 1, etc.).

Moreover, the guide module 704 can be mountable in the rack. The guide module 704 can be mountable above or below the power and network distribution unit 702 in the rack. The power and network distribution unit 702 and the guide module 704 can be positioned at a distance from each other suitable for a size of tray(s) to be utilized therewith. Accordingly, the power and network distribution unit 702 and/or the guide module 704 can be repositioned depending upon the size of the tray(s) being employed therewith.

Further, a tray (e.g., the tray 706, etc.) can be receivable between the power and network distribution unit 702 and the guide module 704 when the power and network distribution unit 702 is mounted at a first position in the rack and the guide module 704 is mounted at a second position in the rack. For instance, the first position can be above or below the second position in the rack. According to an illustration, tray(s) (e.g., including the tray 706) can be slid between the power and network distribution unit 702 and the guide module 704. The power and network distribution unit 702 and/or the guide module 704 provide guidance and support for the tray(s) (e.g., the trays can be slid into grooves on a surface of the power and network distribution unit 702 and/or the guide module 704). Additionally or alternatively, when positioned between the power and network distribution unit 702 and the guide module 704, the tray(s) can be attached to the power and network distribution unit 702 and/or the guide module 704 (e.g., using screws, clips, bolts, etc.).

The power and network distribution unit 702 can further include a backplane 708 that includes a plurality of tray connection points. The power and network distribution unit 702 can supply power and networking to a tray (e.g., the tray 706, etc.) through a particular one of the plurality of tray connection points when coupled with the tray. For instance, the tray can include a blind mate connector (e.g., the blind mate connector 402 of FIG. 4) that couples with the particular one of the plurality of tray connection points of the backplane 708.

Moreover, the power and network distribution unit 702 can include one or more power supplies, which can be substantially similar to the power supplies 202-208 of FIG. 2. As shown in the example of FIG. 7, the power and network distribution unit 702 can include three power supplies: a power supply 710, a power supply 712, and a power supply 714 (collectively referred to as power supplies 710-714). It is to be appreciated, however, that the claimed subject matter is not so limited. A housing of the power and network distribution unit 702 can include portions in which the power supplies 710-714 can be received.

The power and network distribution unit 702 can further include a network and control module 716. The network and control module 716 can provide network distribution similar to the network switches 210-212 of FIG. 2. Moreover, the housing of the power and network distribution unit 702 can include a portion in which the network and control module 716 can be received. According to another example (not shown), it is contemplates that the power and network distribution unit 702 can include network switch(es) instead of the network and control module 716.

Figure 8:
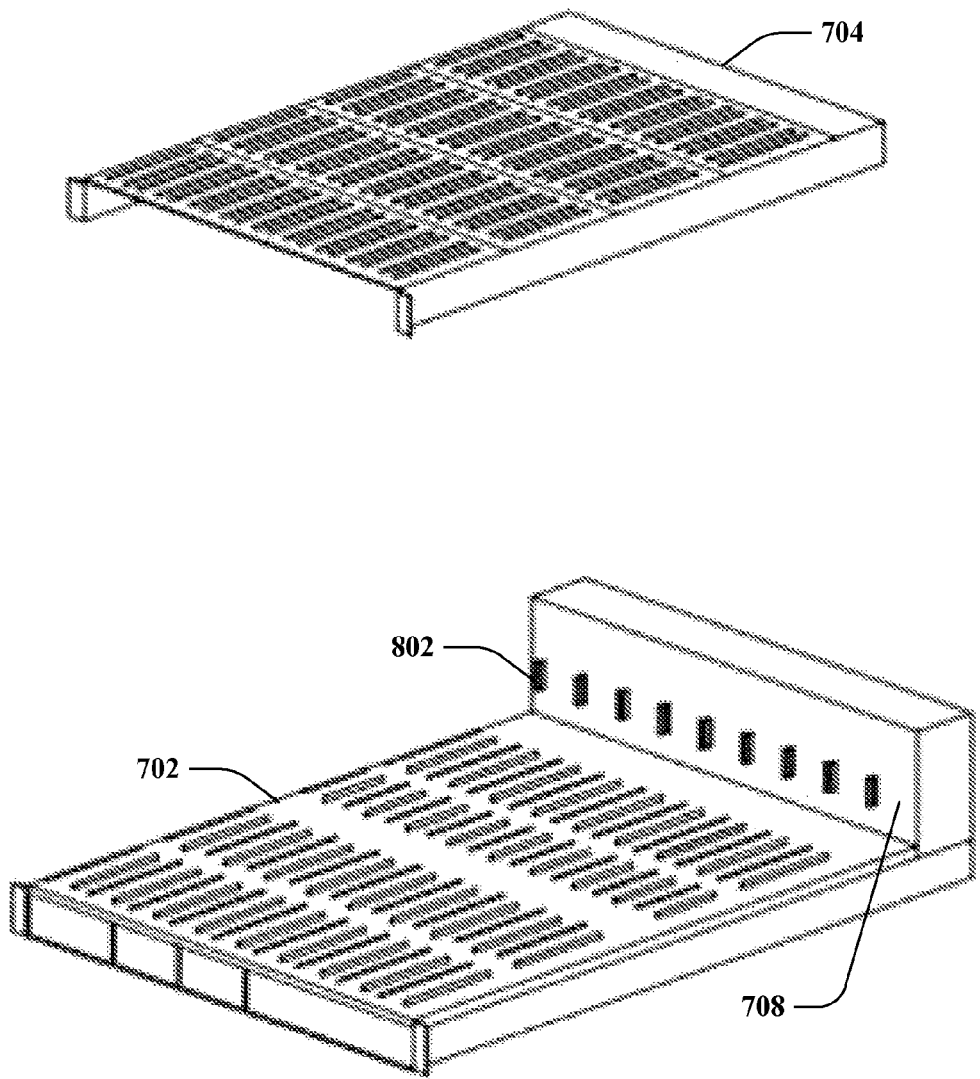
FIG. 8 illustrates an isometric view of the power and network distribution unit and the guide module of FIG. 7.

FIG. 8 shows an isometric view of the power and network distribution unit 702 and the guide module 704 of FIG. 7. The power and network distribution unit 702 is illustrated with the power supplies 710-714 and network and control module 716 removed. As illustrated in FIG. 8, the backplane 708 of the power and network distribution unit 702 includes tray connection points (including a tray connection point 802). By way of example, the backplane 708 can include ten tray connection points, and thus, ten trays can be coupled with the power and network distribution unit 702; however, it is to be appreciated that the backplane 708 is not so limited and can include substantially any number of tray connection points.

The power and network distribution unit 702 and the guide module 704 can be utilized in a rack to receive tray(s) without side walls. Thus, the power and network distribution unit 702 and the guide module 704 can be repositioned within a rack with respect to each other. In comparison, a conventional chassis used with blade servers commonly includes a housing that includes side walls which inhibit reconfiguration such that blades of various sizes are typically unable to be used with a common housing.

Figure 9:
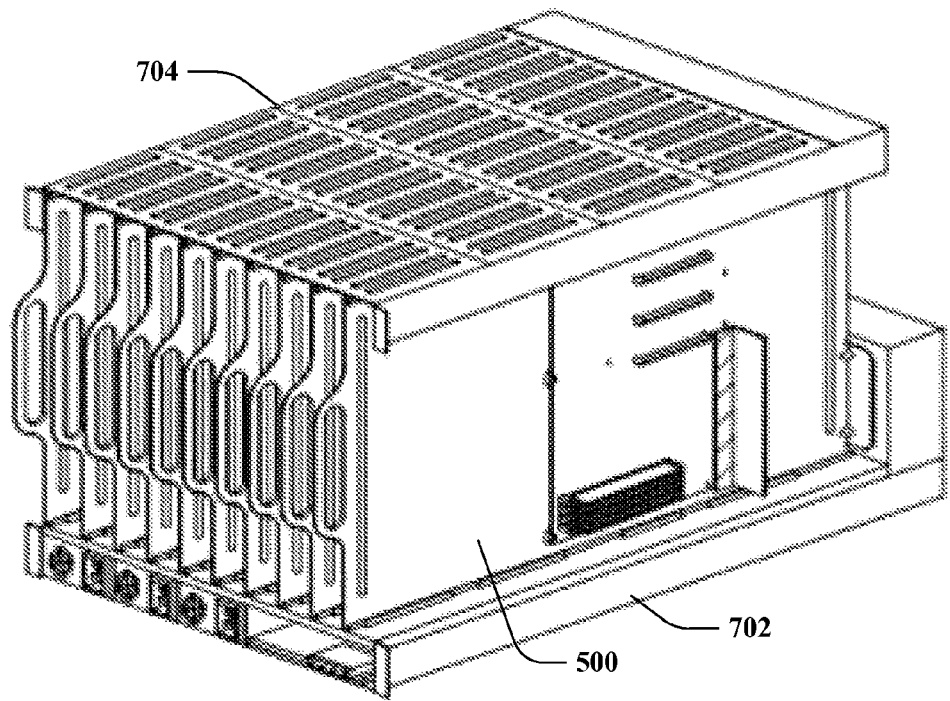
FIGS. 9-10 illustrate isometric views of various exemplary configurations of the power and network distribution unit and the guide module of FIG. 7.
Figure 10:
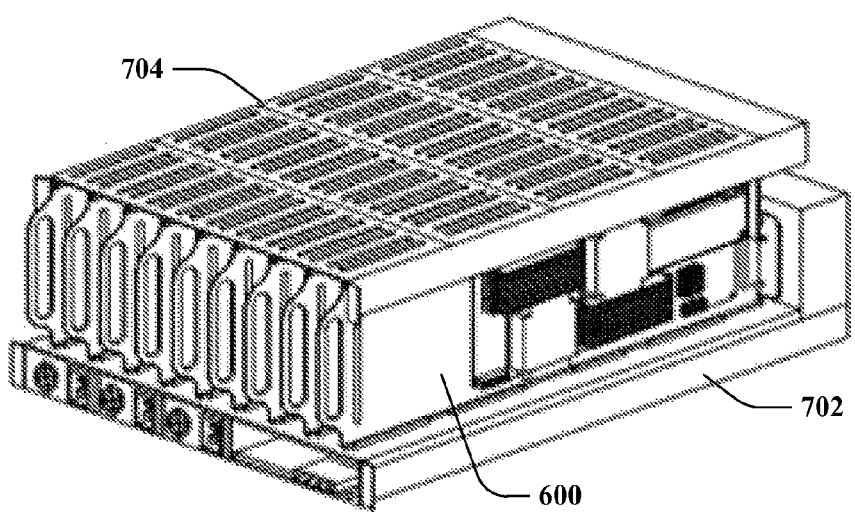

Now referring to FIGS. 9-10, illustrated are isometric views of various exemplary configurations of the power and network distribution unit 702 and the guide module 704 of FIG. 7. The power and network distribution unit 702 and the guide module 704 can be separated by a variable distance to accommodate various sizes of trays (e.g., trays with different widths). As illustrated in FIG. 9, a plurality of trays substantially similar to the tray 500 of FIG. 5 can be received between the power and network distribution unit 702 and the guide module 704. Further as shown in FIG. 10, a plurality of trays substantially similar to the tray 600 of FIG. 6 can be received between the power and network distribution unit 702 and the guide module 704. It is to be appreciated, however, that the claimed subject matter is not limited to the foregoing examples shown in FIGS. 9-10.

Moreover, the power and network distribution unit 702 and/or the guide module 704 can be moved within a rack to accommodate various sizes of trays. Thus, if the tray 500 of FIG. 5 is initially employed, then the power and network distribution unit 702 and the guide module 704 can be positioned with respect to each other as shown in FIG. 9 (e.g., the power and network distribution unit 702 can be mounted at a first position in the rack and the guide module 704 can be mounted at a second position in the rack). Further, if the tray 600 of FIG. 6 is thereafter employed, then the power and network distribution unit 702 and/or the guide module 704 can be repositioned (e.g., within the rack) with respect to each other to be separated as shown in FIG. 10 (e.g., the power and network distribution unit 702 can be reconfigured to be mounted at a third position in the rack and/or the guide module 704 can be reconfigured to be mounted at a fourth position in the rack). Yet, the claimed subject matter is not limited to the above example.

With reference to FIG. 11, illustrated is a schematic diagram of an exemplary system 1100 that provides power to a tray 1102. Although one tray 1102 is shown in FIG. 11, it is to be appreciated that the system 1100 can include a plurality of trays similar to the tray 1102. For instance, the trays can be vertically oriented (e.g., similar to the orientation of the trays in FIG. 7); however, the claimed subject matter is not so limited as it is contemplated that the trays can be horizontally oriented (e.g., similar to the orientation of the trays in FIG. 1) or oriented in substantially any other manner.

The tray 1102 can include a blind mate connector (e.g., the blind mate connector 402 of FIG. 4), which can couple with a tray connector 1104 (e.g., the tray connection point 802 of FIG. 8) of a backplane 1106 (e.g., the backplane 708 of FIG. 7). The backplane 1106 can further include a distribution unit connector 1108. Moreover, a power and network distribution unit 1110 (e.g., one of the power and network distribution units 114-116 of FIG. 1, the power and network distribution unit 200 of FIG. 2, the power and network distribution unit 702 of FIG. 7, etc.) can couple with the distribution unit connector 1108. Pursuant to another example, the power and network distribution unit 1110 can include the backplane 1106.

According to the example depicted in FIG. 11, the power and network distribution unit 1110 can include a connector 1112. Further, a LES 1114 can couple with the connector 1112 of the power and network distribution unit 1110. Moreover, it is contemplated that the connector 1112 can be included in a power supply of the power and network distribution unit 1110, and the LES 1114 can couple with the connector 1112 to interconnect the LES 1114 and the power supply.

Now referring to FIG. 12, illustrated is a schematic diagram of another exemplary system 1200 that provides power to a tray 1202. The tray 1202 can be substantially similar to the tray 1102 of FIG. 11, and can include a blind mate connector (e.g., the blind mate connector 402 of FIG. 4). The blind mate connector of the tray 1102 can couple with a tray connector 1204 (e.g., the tray connection point 802 of FIG. 8) of a backplane 1206 (e.g., the backplane 708 of FIG. 7). The backplane 1206 can further include a distribution unit connector 1208, which can couple with a distribution unit 1210 (e.g., one of the power and network distribution units 114-116 of FIG. 1, the power and network distribution unit 200 of FIG. 2, the power and network distribution unit 702 of FIG. 7, etc.). According to another example, the power and network distribution unit 1210 can include the backplane 1206.

As illustrated in FIG. 12, the backplane 1206 can be coupled with an edge connector board 1212. The edge connector board 1212 can include a connector 1214 that couples with the backplane 1206. Moreover, the edge connector board 1212 can include a connector 1216 that couples with a LES 1218. The connector 1216 can be a front facing connector, which can enable the LES 1218 to be added or removed from in front of a modular equipment rack system. According to an example, a system can be configured without the edge connector board 1212 and the LES 1218. In accordance with other examples, it is contemplated that the edge connector board 1212 can be part of the backplane 1206, included in the power and network distribution unit 1210, and so forth.

Figure 13:
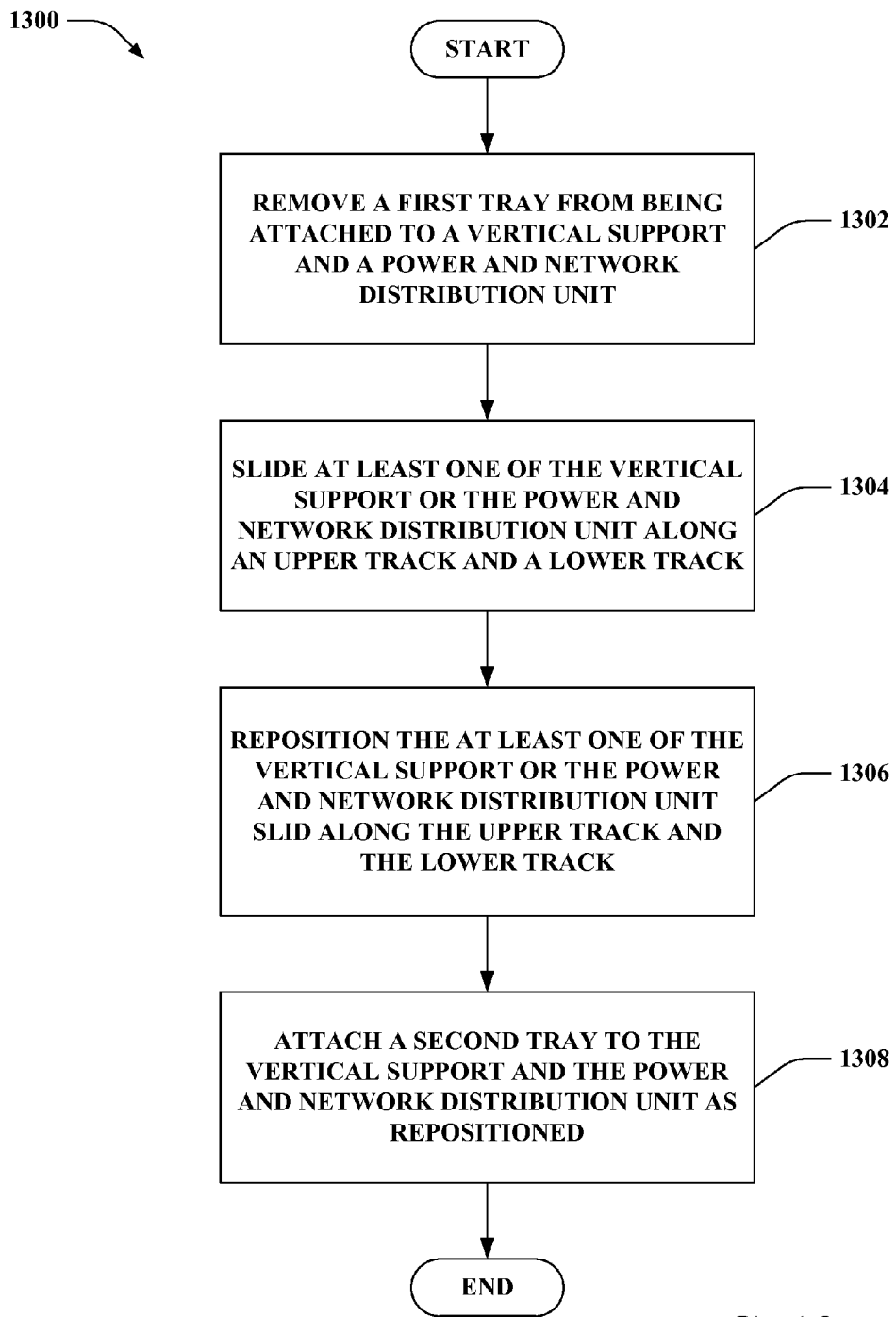
FIG. 13 is a flow diagram that illustrates an exemplary methodology of reconfiguring a modular equipment rack system.

FIG. 13 illustrates an exemplary methodology relating to racking equipment in a data store. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement a methodology described herein.

FIG. 13 illustrates a methodology 1300 of reconfiguring a modular equipment rack system. At 1302, a first tray can be removed from being attached to a vertical support and a power and network distribution unit. The vertical support can be attached to an upper track at a first upper mounting location and a lower track at a first lower mounting location. Moreover, the power and network distribution unit can be attached to the upper track at a second upper mounting location and the lower track at a second lower mounting location.

At 1304, at least one of the vertical support or the power and network distribution unit can be slid along the upper track and the lower track. At 1306, the at least one of the vertical support or the power and network distribution unit slid along the upper track and the lower track can be repositioned. When repositioned, the vertical support can be attached to the upper track at a third upper mounting location and the lower track at a third lower mounting location. Additionally or alternatively, when repositioned, the power and network distribution unit can be attached to the upper track at a fourth upper mounting location and the lower track at a fourth lower mounting location. At 1308, a second tray can be attached to the vertical support and the power and network distribution unit as repositioned. Moreover, a width of the second tray can differ from a width of the first tray.

Further, as used herein, the term "exemplary" is intended to mean "serving as an illustration or example of something."

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A modular equipment rack system for a data center, comprising:
   an upper track that comprises upper mounting locations incrementally spaced along a length of the upper track;
   a lower track that comprises lower mounting locations incrementally spaced along a length of the lower track;
   a vertical support that is attachable to the upper track at the upper mounting locations and attachable to the lower track at the lower mounting locations;
   a power and network distribution unit that is attachable to the upper track at the upper mounting locations and attachable to the lower track at the lower mounting locations; and
   a tray that is attachable to the vertical support and the power and network distribution unit when the vertical support is attached to the upper track at a first upper mounting location and attached to the lower track at a first lower mounting location that corresponds with the first upper mounting location, and the power and network distribution unit is attached to the upper track at a second upper mounting location and attached to the lower track at a second lower mounting location that corresponds with the second upper mounting location.

2. The modular equipment rack system of claim 1, wherein the power and network distribution unit supplies power, networking, and control signals to the tray.

3. The modular equipment rack system of claim 1, wherein the power and network distribution unit further comprises a power supply and a network switch.

4. The modular equipment rack system of claim 3, wherein the power supply is coupled with a local energy storage (LES).

5. The modular equipment rack system of claim 1, wherein the tray comprises a blind mate connector that couples with the power and network distribution unit when the tray is attached to the vertical support and the power and network distribution unit.

6. The modular equipment rack system of claim 5, wherein the power and network distribution unit comprises a backplane that comprises tray connection points that are connectable with the blind mate connector of the tray.

7. The modular equipment rack system of claim 1, wherein the upper mounting locations are spaced at an increment of substantially one inch along the length of the upper rack and the lower mounting locations are spaced at an increment of substantially one inch along the length of the lower rack.

8. The modular equipment rack system of claim 1, wherein the vertical support and the power and network distribution unit are slidable on the upper track and the lower track.

9. The modular equipment rack system of claim 1, wherein a disparate tray with a different width compared to the tray is attachable to the vertical support and the power and network distribution unit when at least one of:
the vertical support is attached to the upper track at a third upper mounting location and attached to the lower track at a third lower mounting location that corresponds with the third upper mounting location; or
the power and network distribution unit is attached to the upper track at a fourth upper mounting location and attached to the lower track at a fourth lower mounting location that corresponds with the fourth upper mounting location.

10. The modular equipment rack system of claim 1, wherein the vertical support comprises vertical mounting locations incrementally spaced along a height of the vertical support and the power and network distribution unit comprises vertical mounting locations incrementally spaced along a height of the power and network distribution unit.

11. The modular equipment rack system of claim 10, wherein the tray is attached to the vertical support at a first vertical mounting location on the vertical support and attached to the power and network distribution unit at a corresponding first vertical mounting location on the power and network distribution unit.

12. The modular equipment rack system of claim 1, wherein the tray comprises at least one of a server or a storage device.

13. A modular equipment rack system for a data center, comprising:
a power and network distribution unit that is mountable in a rack, wherein the power and network distribution unit comprises a backplane that comprises tray connection points;
a guide module that is mountable at least one of above or below the power and network distribution unit in the rack; and
a tray that is receivable between the power and network distribution unit and the guide module when the power and network distribution unit is mounted at a first position in the rack and the guide module is mounted at a second position in the rack, wherein the power and network distribution unit supplies power and networking to the tray through a particular tray connection point when coupled with the tray, and wherein the first position is one of above or below the second position in the rack.

14. The modular equipment rack system of claim 13, wherein the power and network distribution unit further comprises a power supply and a network and control module.

15. The modular equipment rack system of claim 13, wherein the power and network distribution unit comprises a connector that couples with a local energy storage (LES).

16. The modular equipment rack system of claim 13, wherein the power and network distribution unit is coupled with an edge connector board, wherein the edge connector board comprises a connector that couples with a local energy storage (LES).

17. The modular equipment rack system of claim 13, wherein the tray comprises a blind mate connector that couples with the particular one of the plurality of tray connection points of the power and network distribution unit, the tray further comprises at least one of a server or a storage device.

18. The modular equipment rack system of claim 13, wherein the rack is a 19-inch rack.

19. The modular equipment rack system of claim 13, wherein a disparate tray with a different width compared to the tray is attachable to the power and network distribution unit and the guide module when at least one of:
the power and network distribution unit is mounted at a third position in the rack; or
the guide module is mounted at a fourth position in the rack.

20. A method of reconfiguring a modular equipment rack system, comprising:
removing a first tray from being attached to a vertical support and a power and network distribution unit, wherein the vertical support is attached to an upper track at a first upper mounting location and a lower track at a first lower mounting location, and the power and network distribution unit is attached to the upper track at a second upper mounting location and the lower track at a second lower mounting location;
sliding at least one of the vertical support or the power and network distribution unit along the upper track and the lower track;
repositioning the at least one of the vertical support or the power and network distribution unit slid along the upper track and the lower track, wherein at least one of:
the vertical support is attached to the upper track at a third upper mounting location and the lower track at a third lower mounting location; or
the power and network distribution unit is attached to the upper track at a fourth upper mounting location and the lower track at a fourth lower mounting location; and
attaching a second tray to the vertical support and the power and network distribution unit as repositioned, wherein a width of the second tray differs from a width of the first tray.

* * * * *